US008110749B2

(12) United States Patent
Yoshimura et al.

(10) Patent No.: US 8,110,749 B2
(45) Date of Patent: Feb. 7, 2012

(54) PRINTED WIRING BOARD

(75) Inventors: Hideaki Yoshimura, Kawasaki (JP);
Kenji Iida, Kawasaki (JP); Tomoyuki Abe, Kawasaki (JP); Yasutomo Maehara, Kawasaki (JP); Shin Hirano, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 362 days.

(21) Appl. No.: 12/390,168

(22) Filed: Feb. 20, 2009

(65) Prior Publication Data

US 2009/0294166 A1    Dec. 3, 2009

(30) Foreign Application Priority Data

May 30, 2008    (JP) .................. 2008-143449

(51) Int. Cl.
H05K 1/16    (2006.01)
(52) U.S. Cl. ........................ 174/260; 361/792
(58) Field of Classification Search ........... 361/792–795
See application file for complete search history.

(56) References Cited

U.S. PATENT DOCUMENTS

| | | | |
|---|---|---|---|
| 4,667,401 A | 5/1987 | Clements et al. | |
| 4,696,764 A | 9/1987 | Yamazaki | |
| 4,859,364 A | 8/1989 | Yamamoto et al. | |
| 5,242,511 A | 9/1993 | Yokoyama et al. | |
| 5,445,308 A | 8/1995 | Nelson et al. | |
| 5,573,602 A | 11/1996 | Banerji et al. | |
| 5,648,123 A | 7/1997 | Kuhn et al. | |
| 5,652,042 A | 7/1997 | Kawakita et al. | |
| 5,949,030 A | 9/1999 | Fasano et al. | |
| 6,139,777 A | 10/2000 | Omoya et al. | |
| 6,479,763 B1 | 11/2002 | Igaki et al. | |
| 6,851,599 B2 | 2/2005 | Nakamura et al. | |
| 6,869,665 B2 | 3/2005 | Tani et al. | |
| 7,224,046 B2 | 5/2007 | Abe et al. | |
| 7,307,852 B2 * | 12/2007 | Inagaki et al. | 361/760 |
| 7,345,246 B2 * | 3/2008 | Muramatsu et al. | 174/260 |

(Continued)

FOREIGN PATENT DOCUMENTS

CN    1465219 A    12/2003

(Continued)

OTHER PUBLICATIONS

Korean Office Action dated Oct. 21, 2010, issued in corresponding Korean Patent Application No. 10-2009-0019784.

(Continued)

*Primary Examiner* — Thanh Tam Le
(74) *Attorney, Agent, or Firm* — Westerman, Hattori, Daniels & Adrian, LLP

(57) ABSTRACT

Large-sized through holes are formed in a core layer of a printed wiring board. Large-sized vias are formed in the shape of a cylinder along the inward wall surfaces of the large-sized through holes located within a specific area. A filling material fills the inner space of the large-sized via. A small-sized through hole penetrates through the corresponding filling material along the longitudinal axis of the small-sized through hole. A small-sized via is formed in the shape of a cylinder along the inward wall surface of the small-sized through hole. The filling material and the core layer are uniformly distributed within the specific area in the in-plane direction of the core substrate. This results in suppression of uneven distribution of thermal stress in the core layer in the in-plane direction of the core layer.

4 Claims, 9 Drawing Sheets

U.S. PATENT DOCUMENTS

| | | | |
|---|---|---|---|
| 7,507,913 B2 * | 3/2009 | Inagaki et al. | 174/260 |
| 7,640,660 B2 | 1/2010 | Abe et al. | |
| 7,696,442 B2 * | 4/2010 | Muramatsu et al. | 174/260 |
| 7,842,887 B2 * | 11/2010 | Sakamoto et al. | 174/260 |
| 7,855,894 B2 * | 12/2010 | Inagaki et al. | 361/763 |
| 7,864,542 B2 * | 1/2011 | Inagaki et al. | 361/763 |
| 2003/0196833 A1 | 10/2003 | Fujii et al. | |
| 2004/0011855 A1 | 1/2004 | Nakamura et al. | |
| 2004/0151882 A1 | 8/2004 | Tani et al. | |
| 2004/0238209 A1 | 12/2004 | Yuri et al. | |
| 2005/0172483 A1 | 8/2005 | Sugita et al. | |
| 2005/0266213 A1 | 12/2005 | Kanda et al. | |
| 2006/0118329 A1 | 6/2006 | Nakamura | |

FOREIGN PATENT DOCUMENTS

| | | | |
|---|---|---|---|
| CN | 1698138 A | 11/2005 | |
| EP | 0 793 405 A2 | 3/1997 | |
| JP | 10-007933 A | 1/1998 | |
| JP | 2003-273518 A | 9/2003 | |
| JP | 2003-527736 A | 9/2003 | |
| JP | 2004031730 A | 1/2004 | |
| JP | 2004031731 A | 1/2004 | |
| JP | 2004289006 A | 10/2004 | |
| JP | 2005-71825 A | 3/2005 | |
| JP | 2005-347414 A | 12/2005 | |
| KR | 1999-0044871 A | 6/1999 | |
| KR | 2003-0027111 A | 4/2003 | |
| KR | 10-2004-0027326 A | 4/2004 | |
| TW | 200414860 A | 8/2004 | |
| WO | 99/56509 A1 | 11/1999 | |

OTHER PUBLICATIONS

Korean Office Action dated Oct. 21, 2010, issued in corresponding Korean Patent Application No. 10-2009-0019785.
Chinese Office Action dated Jan. 19, 2011, issued in corresponding Chinese Patent Application No. 200910126964.X.
USPTO Office Action dated May 31, 2011, issued in U.S. Appl. No. 12/390,131.
Korean Office Action dated Oct. 21, 2010, issued in corresponding Korean Patent Application No. 10-2009-0020281.
USPTO Office Action dated Jun. 30, 2011, issued in U.S. Appl. No. 12/390,010.
USPTO Office Action dated Jun. 15, 2011, issued in U.S. Appl. No. 12/365,279.
Office Action dated Nov. 16, 2011, issued in related U.S. Appl. No. 12/390,131.
Notice of Allowance and Fees Due dated Oct. 25, 2011, issued in related U.S. Appl. No. 12/390,010.
Taiwanese Office Action dated Oct. 5, 2011, issued in corresponding Taiwanese Patent Application No. 098104959 (partial translation).
Notice of Allowance and Fees Due dated Dec. 5, 2011, issued in related U.S. Appl. No. 12/365,279.

* cited by examiner

PRINTED WIRING BOARD

CROSS-REFERENCE TO RELATED APPLICATION

This application is based upon and claims the benefit of priority from the prior Japanese Patent Application No. 2008-143449 filed on May 30, 2008, the entire contents of which are incorporated herein by reference.

FIELD

The embodiments discussed herein are related to a printed wiring board including a core layer having electrical conductivity.

BACKGROUND

A printed wiring board such as a probe card is well known. The probe card is utilized for examining a semiconductor wafer and an LSI (large-scale integrated circuit) chip package, for example. A semiconductor wafer or an LSI chip package is set on the probe card. A high temperature operation test such as a burn-in test, or a low temperature operation such as screening is executed. The probe card is subjected to a change in the temperature, namely thermal stress such as a heat cycle. The temperature is changed within a range set for the high temperature test or the low temperature test.

The LSI chip includes a silicon substrate, for example. Since the coefficient of thermal expansion of silicon is relatively low, the coefficient of thermal expansion of the LSI chip can be set relatively low. The core substrate of the probe card is made out of carbon fiber cloth impregnated with a resin material, for example. The carbon fiber cloth serves to reduce the coefficient of thermal expansion of the core substrate. The coefficient of thermal expansion of the probe card can be equalized to that of the LSI chip. The electrically-conductive pads of the probe card can thus be positioned to their respective electrode pins of the LSI chip with accuracy, for example.

Secondary through holes are formed in the core substrate of the probe card. A cylindrical large-sized via having a large diameter is formed on the inner wall surface of the individual large-sized through hole. An inner space defined in the large-sized via is filled with a secondary filling material made of a resin material. A through hole is formed in the secondary filling material. A cylindrical small-sized via having a small diameter is formed on the inner wall surface of the through hole. An inner space defined in the small-sized via is filled with a filling material. The filling material is made of epoxy resin, for example. In this manner, a double via is formed.

Simultaneously, certain one or ones of the large-sized through holes have a cylindrical via formed on the inward wall surface thereof. An inner space defined in the via is filled with a filling material. No through hole is formed in the filling material. In this manner, a single via is formed. The carbon fiber cloth allows the core substrate to be electrically conductive. The carbon fiber cloth is exposed on the inward wall surfaces of the large-sized through holes. Since the via is electrically connected to the core substrate, the core substrate can function as a power supply layer or a ground layer.

The core substrate has the single via and the double vias formed therein. The amount of the carbon fiber cloth and the amount of the filling material are thus uneven in the in-plane direction of the core substrate. Since the coefficient of thermal expansion of the carbon fiber cloth is different from that of the filling material, distortion is induced in the in-plane direction of the core substrate in response to thermal stress during a heat cycle test, for example. The distortion causes a so-called crack. The crack results in breaking of the electrically-conductive pattern.

SUMMARY

According to an aspect of the invention, a printed wiring board includes: a core layer having electrical conductivity; large-sized through holes formed in the core layer, the large-sized through holes penetrating through the core layer from the front surface of the core layer to the back surface of the core layer; a large-sized via having electrical conductivity, the large-sized via formed in the shape of a cylinder along the inward wall surface of each of all the large-sized through holes located within a specific area; a filling material filling the inner space defined in the large-sized via; a small-sized through hole formed in the filling material, the small-sized through hole penetrating through the filling material along the longitudinal axis of the small-sized through hole; and a small-sized via having electrical conductivity, the small-sized via formed in the shape of a cylinder along the inward wall surface of the small-sized through hole.

The object and advantages of the embodiment will be realized and attained by means of the elements and combinations particularly pointed out in the appended claims. It is to be understood that both the foregoing general description and the following detailed description are exemplary and explanatory and are not restrictive of the embodiment, as claimed.

DESCRIPTION OF EMBODIMENTS

Embodiments of the present invention will be explained below with reference to the accompanying drawings.

Figure 1:
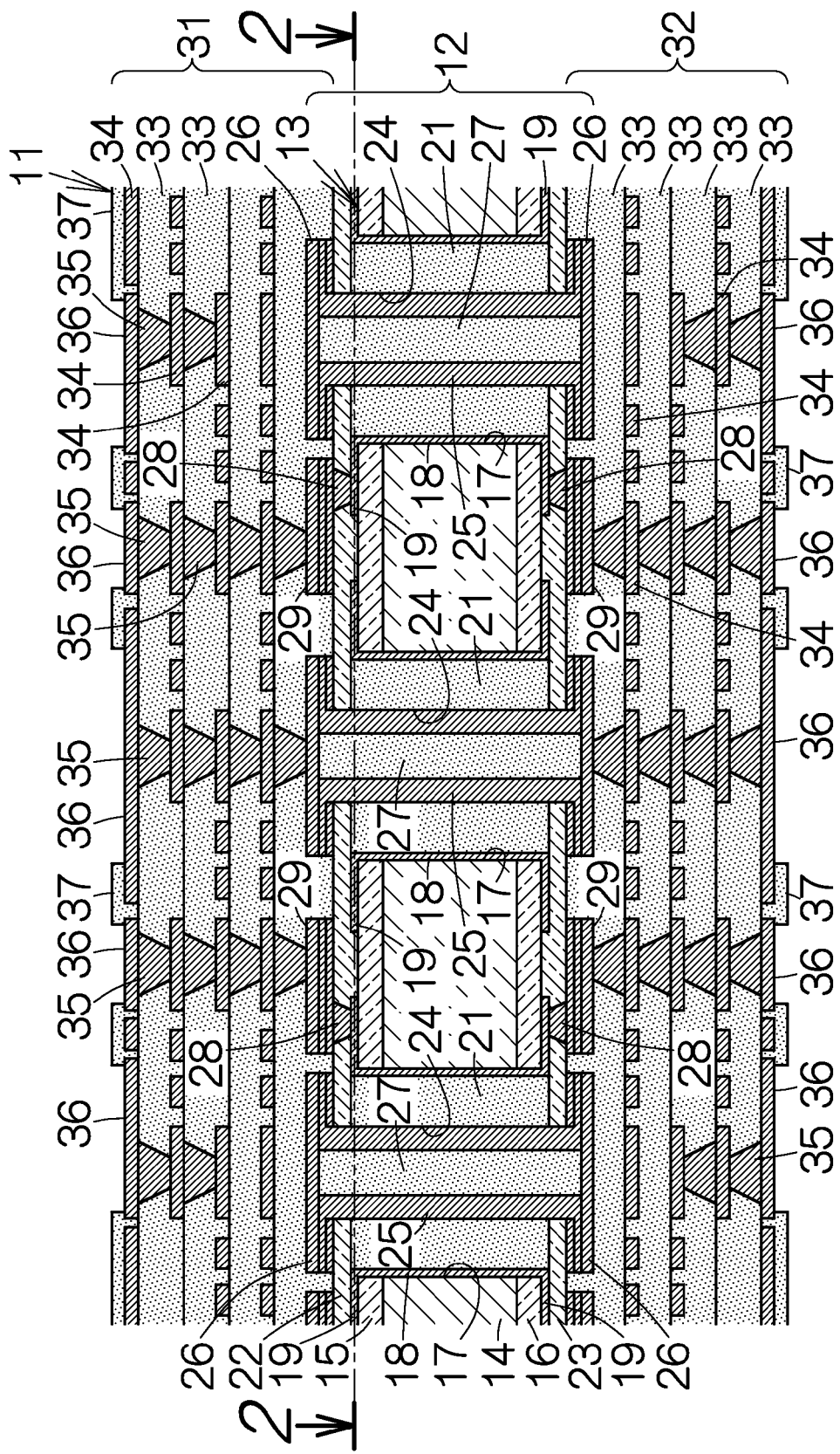
FIG. 1 is an enlarged partial sectional view schematically illustrating the cross-section of a printed wiring board according to an embodiment of the present invention.

FIG. 1 schematically illustrates the cross-section of a printed wiring board 11 according to an example of the present invention. The printed wiring board 11 is utilized as a probe card, for example. Such a probe card is set in a probe apparatus, for example. It should be noted that the printed wiring board 11 may be utilized in any other electronic apparatus.

The printed wiring board 11 includes a core substrate 12. The core substrate 12 includes a core layer 13 in the form of a thin plate. The core layer 13 includes an electrically-conductive layer 14. Carbon fiber cloth is embedded in the electrically-conductive layer 14. The fibers of the carbon fiber cloth extend along the front and back surfaces of the core layer 13. This results in a significant restriction of the thermal expansion of the electrically-conductive layer 14 in the in-plane direction. The carbon fiber cloth has an electrical conductivity. The carbon fiber cloth is impregnated with a resin material so as to form the electrically-conductive layer 14. The resin material is a thermosetting resin such as epoxy resin. The carbon fiber cloth is a woven or nonwoven cloth made of carbon fiber yarns.

The core layer 13 includes core insulating layers 15, 16 overlaid on the front and back surfaces of the electrically-conductive layer 14, respectively. The electrically-conductive layer 14 is sandwiched between the core insulating layers 15, 16. The core insulating layers 15, 16 are insulative. Glass fiber cloth is embedded in the core insulating layers 15, 16. The fibers of the glass fiber cloth extend along the front and back surfaces of the core layer 13. The glass fiber cloth is impregnated with a resin material so as to form the core insulating layers 15, 16. The resin material is a thermosetting resin such as epoxy resin. The glass fiber cloth is a woven or nonwoven cloth made of glass fiber yarns.

Large-sized through holes 17 are formed in the core layer 13. The large-sized through holes 17 penetrate through the core layer 13 from the front surface to the back surface of the core layer 13. The large-sized through holes 17 each define a columnar space. The longitudinal axis of the columnar space is set perpendicular to the front and back surfaces of the core layer 13. The individual large-sized through hole 17 defines circular openings on the front and back surfaces of the core layer 13, respectively. The carbon fiber cloth of the electrically-conductive layer 14 is exposed at the inward wall surface of the individual large-sized through hole 17.

A large-sized via 18 having a large diameter is formed in the individual large-sized through hole 17. The large-sized via 18 is electrically conductive. The large-sized via 18 is formed in the shape of a cylinder along the inward wall surface of the large-sized through hole 17. Since the carbon fiber cloth is exposed at the inward wall surface of the large-sized through hole 17 as described above, electrical connection is established between the large-sized via 18 and the carbon fiber cloth. The large-sized via 18 is connected to annular electrically-conductive lands 19 on the front and back surfaces of the core layer 13. The electrically-conductive lands 19 extend on the front and back surfaces of the core layer 13. The large-sized via 18 and the electrically-conductive lands 19 are made of an electrically-conductive material such as copper.

The inner space of the large-sized via 18 in the large-sized through hole 17 is filled with a filling material 21 made of a resin material. The filling material 21 takes the form of a cylinder along the inward wall surface of the large-sized via 18. The filling material 21 is a thermosetting resin such as epoxy resin. A ceramic filler is embedded in the epoxy resin, for example.

The core substrate 12 includes insulating layers 22, 23 overlaid on the front and back surfaces of the core layer 13, respectively. The back surfaces of the insulating layers 22, 23 are received on the front and back surfaces of the core layer 13, respectively. The core layer 13 is sandwiched between the insulating layers 22, 23. The insulating layers 22, 23 cover over the exposed surfaces of the filling material 21. The insulating layers 22, 23 are insulative. Glass fiber cloth is embedded in the insulating layers 22, 23. The fibers of the glass fiber cloth extend along the front and back surfaces of the core layer 13. The glass fiber cloth is impregnated with a resin material for forming the insulating layers 22, 23. The resin material is a thermosetting resin such as epoxy resin. The glass fiber cloth is a woven or nonwoven cloth made of glass fiber yarns.

Small-sized small-sized through holes 24 are formed in the core substrate 12. The small-sized through holes 24 penetrate through the core layer 13 and the insulating layers 22, 23. The individual small-sized through hole 24 is located inside the corresponding large-sized through hole 17. The small-sized through hole 24 penetrates through the corresponding filling material 21. Here, the small-sized through holes 24 each define a columnar space. The individual small-sized through hole 24 is coaxial with the corresponding large-sized through hole 17. The individual small-sized through hole 24 defines circular openings on the front and back surfaces of the core substrate 12, respectively.

A small-sized via 25 having a diameter smaller than that of the large-sized via 18 is formed in the individual small-sized through hole 24. The small-sized via 25 is electrically conductive. The small-sized via 25 is formed in the shape of a cylinder along the inward wall surface of the small-sized through hole 24. The filling material 21 serves to insulate the large-sized via 18 and the small-sized via 25 from each other. The small-sized via 25 is made of an electrically-conductive material such as copper.

Electrically-conductive lands 26 are formed on the surfaces of the insulating layers 22, 23. The small-sized via 25 is connected to the electrically-conductive lands 26 on the surfaces of the insulating layers 22, 23. The electrically-conductive lands 26 are made of an electrically-conductive material such as copper. The inner space of the small-sized via 25 is filled with a filling material 27 made of an insulating resin between the electrically-conductive lands 26, 26. The filling material 27 is formed in the shape of a column, for example. The filling material 27 is a thermosetting resin such as epoxy resin. Ceramic fillers are embedded in the epoxy resin.

Electrically-conductive materials, namely vias 28, are formed in the insulating layers 22, 23. The vias 28 are connected to electrically-conductive patterns 29 formed on the back surfaces of the insulating layers 22, 23, for example. Electrical connection is in this manner established between the electrically-conductive patterns 29 and the electrically-conductive layer 14 through the vias 28, the electrically-conductive lands 19 and the small-sized vias 25. The electrically-conductive layer 14 thus functions as the power supply layer or the ground layer of the printed wiring board 11, for example. The vias 28 and the electrically-conductive patterns 29 are made of an electrically-conductive material such as copper.

Build-up layers 31, 32 are formed on the surfaces of the insulating layers 22, 23, respectively. The back surfaces of the build-up layers 31, 32 are received on the surfaces of the insulating layers 22, 23, respectively. The core layer 13 and the insulating layers 22, 23 are sandwiched between the build-up layers 31, 32. The build-up layers 31, 32 cover over the electrically-conductive lands 26, 26 and the electrically-conductive patterns 29.

The build-up layers 31, 32 are multilayered structure body including insulating layers 33 and electrically-conductive patterns 34. The insulating layers 33 and the electrically-conductive patterns 34 are alternatively overlaid on one another. Electrical connection is established between the electrically-conductive patterns 34 formed in different layers through vias 35. The insulating layers 33 are made of a thermosetting resin such as epoxy resin. The electrically-conductive patterns 34 and the vias 35 are made of an electrically-conductive material such as copper.

Electrically-conductive pads 36 are exposed on the surfaces of the build-up layers 31, 32. The electrically-conductive pads 36 are made of an electrically-conductive material such as copper. An overcoat layer 37 is overlaid on the surface of each of the build-up layers 31, 32 at positions off the electrically-conductive pads 36. The overcoat layer 37 is made of epoxy resin, for example. The electrically-conductive pads 36 on the back surface of the printed wiring board 11 are connected to the electrode terminals on a probe apparatus, for example. The electrically-conductive pads 36 on the front surface of the printed wiring board 11 are mounted on the electrode bumps of a semiconductor wafer, for example. A heat cycle test is then executed so as to examine the semiconductor wafer, for example.

Figure 2:
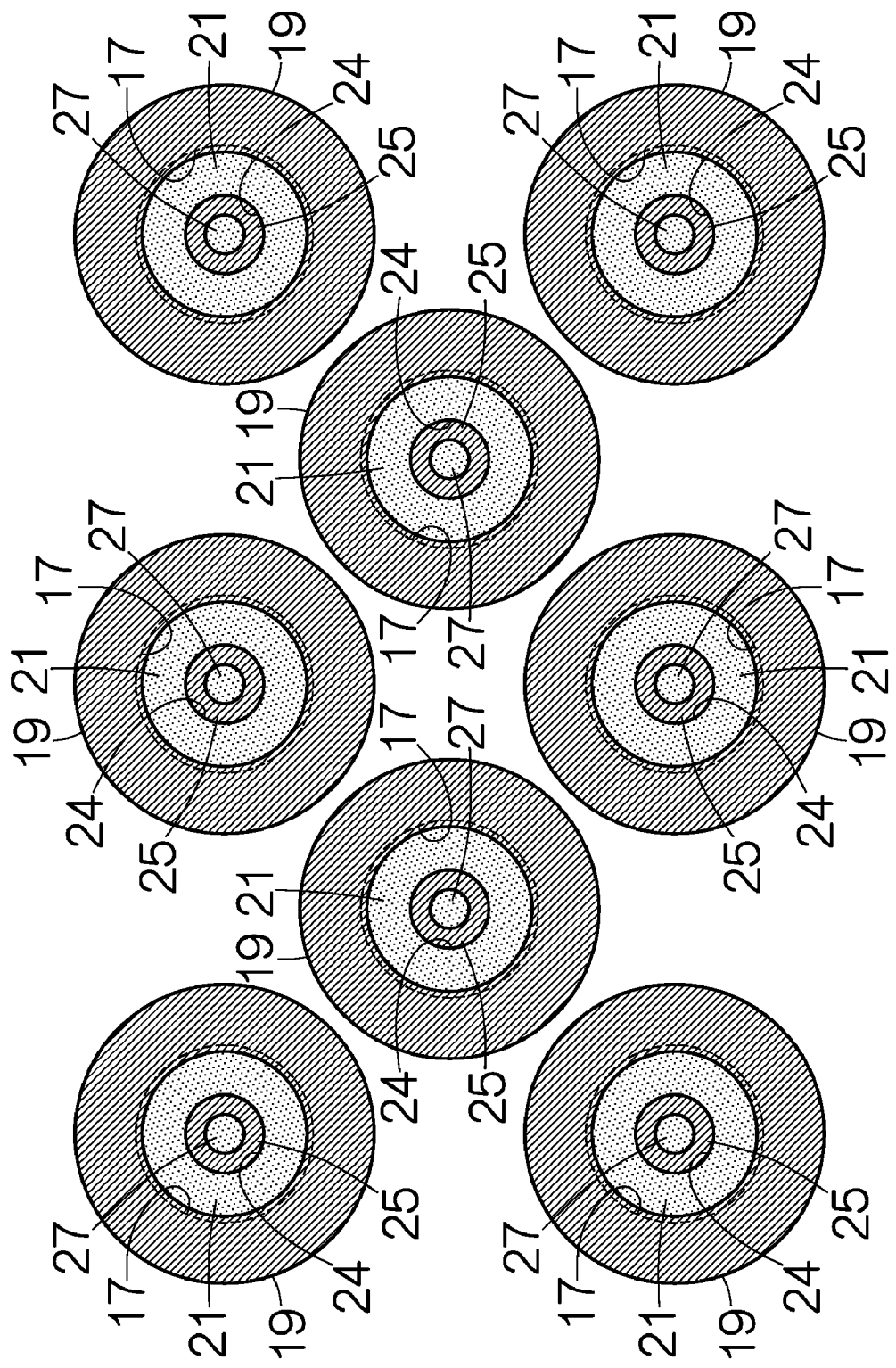
FIG. 2 is a sectional view taken along the line 2-2 in FIG. 1.

As shown in FIG. 2, all the large-sized through holes 17 located within a specific area are uniformly distributed. The present embodiment allows a uniform distribution of all the large-sized through holes 17 formed in the core substrate 12. Here, four of the large-sized through holes 17 are positioned at the corners of a square around an arbitrary one of the large-sized through holes 17 located at the intersection of the diagonals for achievement of a uniform distribution of the large-sized through holes 17. The arbitrary one of the large-sized through holes 17 is equally spaced from the large-sized through holes 17 at the corners of the square.

In the printed wiring board 11, all the large-sized through holes 17 located within a specific area have a specific identical structure including the large-sized through hole 17, the large-sized via 18, the filling material 21, the small-sized through hole 24, the small-sized via 25 and the filling material 27. The filling material 21, 27 and the carbon fiber cloth are thus uniformly distributed in the core substrate 12 in the in-plane direction of the core substrate 12. This results in suppression of uneven distribution of thermal stress in the core substrate 12 in the in-plane direction of the core substrate 12. Cracks are suppressed in the build-up layers 31, 32, for example. Break of the electrically-conductive patterns 34 is avoided. Moreover, since all the large-sized through holes 17 are uniformly distributed within the specific area, suppression of uneven distribution of thermal stress is promoted in the core substrate 12 in the in-plane direction of the core substrate 12.

In the case where the printed wiring board has different structures of the large-sized through holes in each area, the carbon fiber cloth and the filling material are unevenly distributed in the core substrate in the in-plane direction of the core substrate. Since the coefficient of thermal expansion of the carbon fiber cloth is different from that of the filling material, thermal stress is unevenly distributed in the core substrate in the in-plane direction of the core substrate during a heat cycle test, for example. The uneven distribution causes cracks in the core substrate. The cracks result in break of the electrically-conductive pattern.

Figure 3:
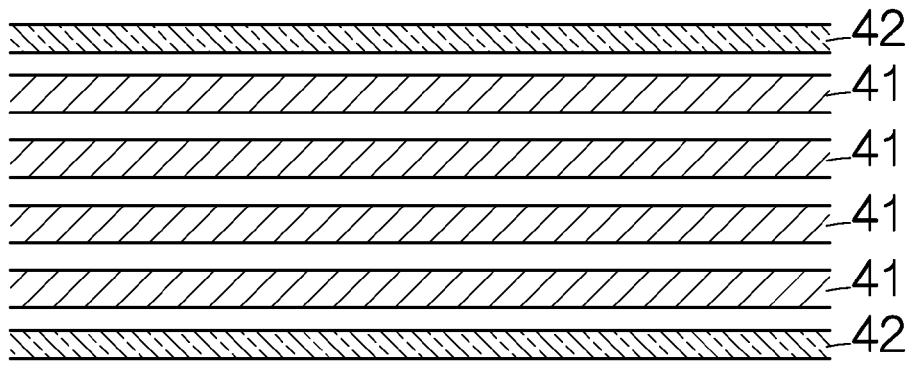
FIG. 3 is an enlarged partial sectional view schematically illustrating a process of overlaying prepregs on one another.

Next, description will be made on a method of making the printed wiring board 11. The core substrate 12 is first prepared. As shown in FIG. 3, four prepregs 41 are prepared, for example. The individual prepreg 41 contains carbon fiber cloth. Simultaneously, a pair of prepregs 42 is prepared, for example. The individual prepreg 42 contains glass fiber cloth. The carbon fiber cloth is impregnated with epoxy resin varnish for forming the prepregs 41. Likewise, the glass fiber cloth is impregnated with epoxy resin varnish for forming the prepregs 42. The epoxy resin varnish is then dried. The prepregs 41, 42 are in this manner formed.

Figure 4:
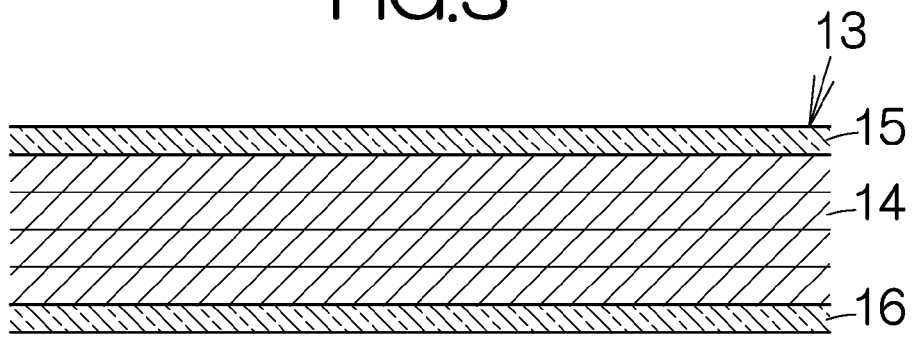
FIG. 4 is an enlarged partial sectional view schematically illustrating the process of overlaying prepregs on one another.

The prepregs 41 are sandwiched between the prepregs 42, 42. The prepregs 42 are urged against each other while being subjected to a heating process. A vacuum press is employed to urge the prepregs 42, for example. The peak temperature of the heating process and the pressure of the vacuum press are set in accordance with predetermined conditions. The prepregs 41, 42 are bonded together based on the molten epoxy resin. In this manner, the core layer 13 is formed, as shown in FIG. 4. The prepregs 41 provides form the electrically-conductive layer 14. The prepregs 42 form the core insulating layers 15, 16, respectively.

Figure 5:
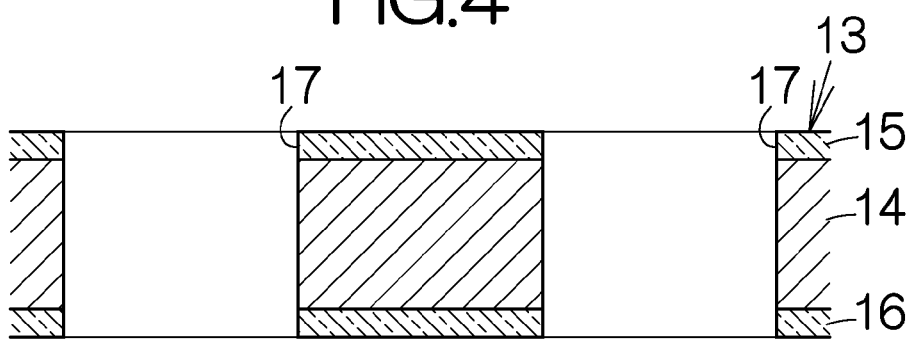
FIG. 5 is an enlarged partial sectional view schematically illustrating a process of forming large-sized through holes in a core layer.
Figure 6:
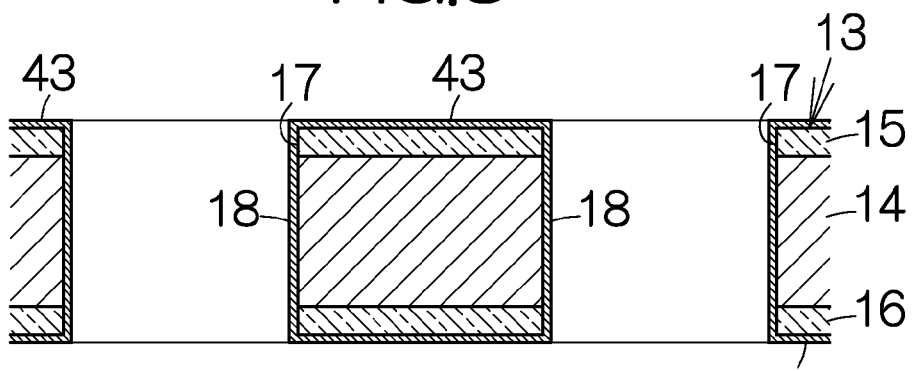
FIG. 6 is an enlarged partial sectional view schematically illustrating a process of forming a copper plating layer on the core layer.

As shown in FIG. 5, the through holes 17 are formed in the core layer 13 at predetermined positions. A drill may be utilized to form the through holes 17, for example. The through holes 17 penetrate through the core layer 13 from the front surface to the back surface of the core layer 13. Electrolytic plating or electroless plating is effected on the entire surface of the core layer 13, for example. A copper plating layer 43 is thus formed over the entire surface of the core layer 13, as shown in FIG. 6. The copper plating layer 43 is formed along the front and back surfaces of the core layer 13 and the inward wall surfaces of the through holes 17 at a predetermined thickness. In this manner, the large-sized vias 18 are formed inside the through holes 17.

Figure 7:
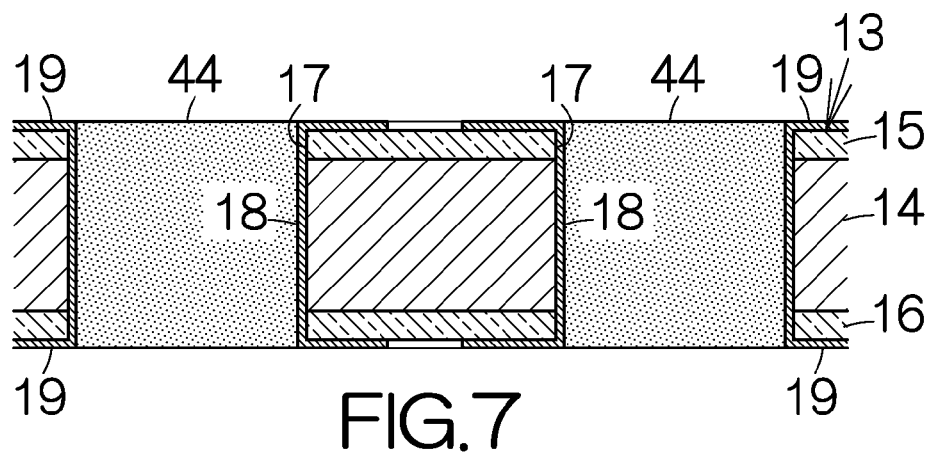
FIG. 7 is an enlarged partial sectional view schematically illustrating a process of pouring a resin material into the large-sized through holes.

As shown in FIG. 7, a resin material 44 is filled in the large-sized vias 18. The resin material 44 is a solvent epoxy resin, for example. The resin material 44 is subjected to a heating process. The resin material 44 is thus hardened or cured. Buffing is employed to remove the resin material 44 overflowing from the large-sized vias 18, for example. A resist film, not shown, is then formed on each of the front and back surfaces of the core layer 13 in a predetermined pattern. Etching is effected on the copper plating layer 43 outside the contour of the resist film. The resist film is removed after the etching. The electrically-conductive lands 19 are thus formed on the front and back surfaces of the core layer 13.

Figure 8:
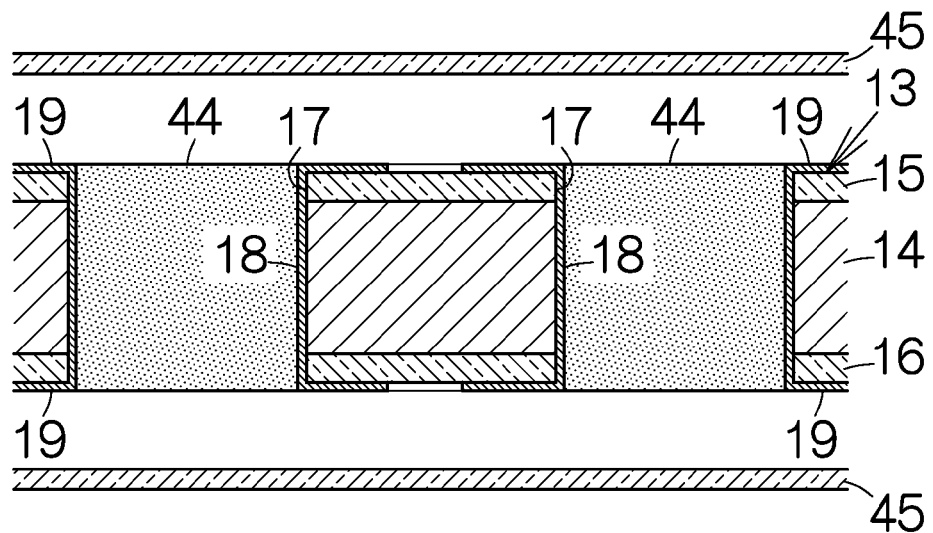
FIG. 8 is an enlarged partial sectional view schematically illustrating a process of overlaying a prepreg and a copper foil on each of the front and back surfaces of the core layer.
Figure 9:
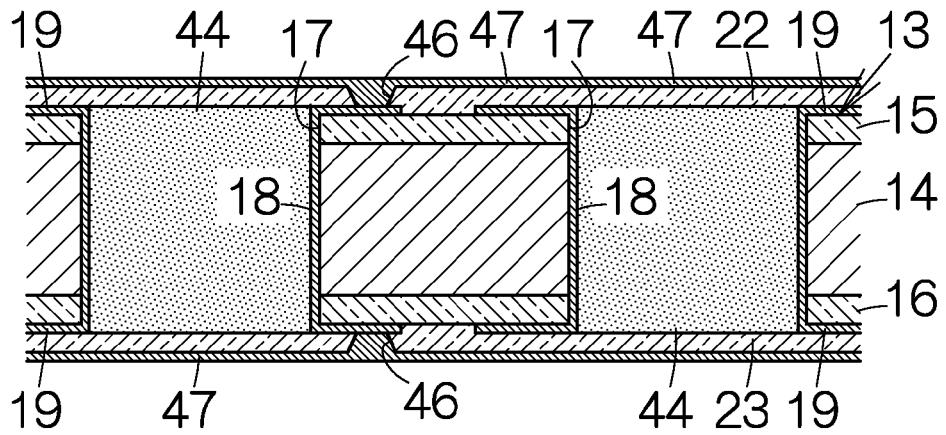
FIG. 9 is an enlarged partial sectional view schematically illustrating the process of overlaying a prepreg and a copper foil on each of the front and back surfaces of the core layer.

As shown in FIG. 8, a pair of prepregs 45, 45 are prepared. The prepregs 45 have the same structure as that of the aforementioned prepregs 42. The prepregs 45 are overlaid on the front and back surfaces of the core layer 13, respectively. The prepregs 45 are urged against the front and back surfaces of the core layer 13 while being subjected to a heating process. A vacuum press is employed to urge the prepregs 45. The peak temperature of the heating process and the duration of the vacuum press are set in accordance with predetermined conditions. The prepregs 45 are bonded to the front and back surfaces of the core layer 13, respectively, as shown in FIG. 9, based on the molten epoxy resin. The prepregs 45 form the insulating layers 22, 23.

A UV-YAG laser is applied to the insulating layers 22, 23 at predetermined positions, for example. Apertures 46 are thus formed in the insulating layers 22, 23. The electrically-conductive lands 19 are exposed at the bottoms of the apertures 46, for example. Electrolytic plating or electroless plating is effected on the entire surface of the core layer 13, for example. A copper plating layer 47 is thus formed over the entire surface of the core layer 13. The copper plating layer 47 is formed along the front and back surfaces of the core layer 13 at a predetermined thickness. The vias 28 are thus formed in the apertures 46.

Figure 10:
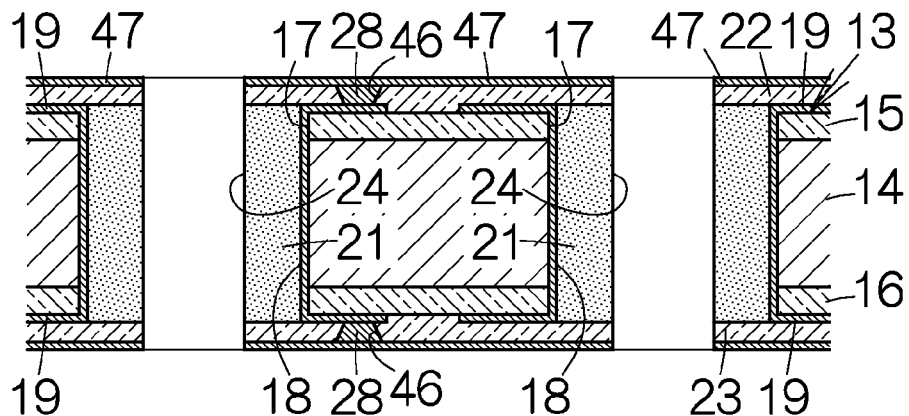
FIG. 10 is an enlarged partial sectional view schematically illustrating a process of forming through holes in the core layer.
Figure 11:
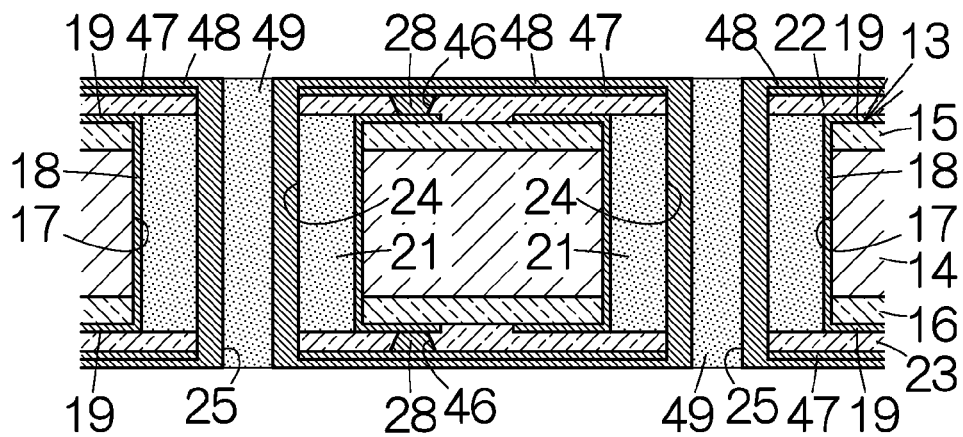
FIG. 11 is an enlarged partial sectional view schematically illustrating a process of forming a copper plating layer.

As shown in FIG. 10, the small-sized through holes 24 are formed in the resin material 44 inside the large-sized through holes 17 of the core layer 13. The small-sized through holes 24 may be coaxial with the corresponding large-sized through holes 17. A drill may be utilized to form the small-sized through holes 24, for example. Electrolytic plating or electroless plating is effected on the entire surface of the core layer 13, for example. A copper plating layer 48 is thus formed over the entire surface of the core layer 13, as shown in FIG. 11. The copper plating layer 48 is formed along the front and back surfaces of the core layer 13 and the inward wall surfaces of the small-sized through holes 24 at a predetermined thickness. The small-sized vias 25 are in this manner formed in the small-sized through holes 24.

Figure 12:
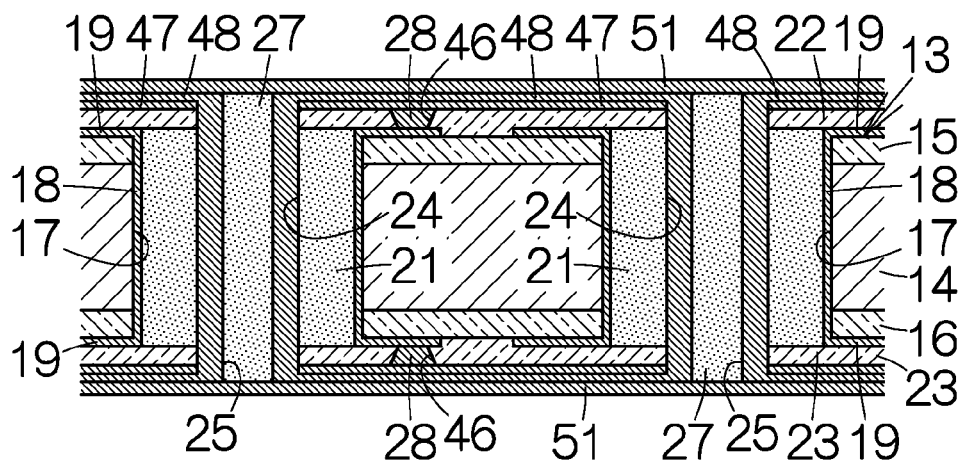
FIG. 12 is an enlarged partial sectional view schematically illustrating a process of forming a copper plating layer.
Figure 13:
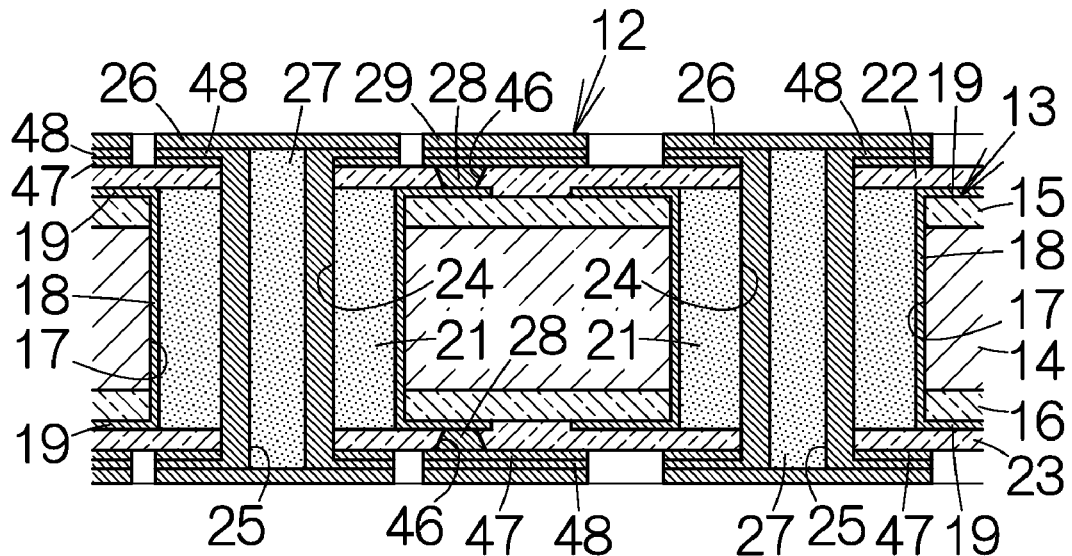
FIG. 13 is an enlarged partial sectional view schematically illustrating a process of forming electrically-conductive lands.

A resin material 49 is filled in the small-sized vias 25. The resin material 49 is a solvent epoxy resin, for example. The resin material 49 is subjected to a heating process. The resin material 49 is thus hardened or cured. Buffing is employed so as to remove the resin material 49 overflowing from the small-sized vias 25, for example. Electrolytic plating or electroless plating is effected on the entire surface of the core layer 13, for example. In this manner, a copper plating layer 51 is formed on each of the front and back surfaces of the core layer 13, as shown in FIG. 12. The openings of the small-sized through holes 24 are closed with the copper plating layer 51. A resist film, not shown, is formed on each of the front and back surfaces of the core layer 13 in a predetermined pattern. Etching is effected on the copper plating layer 51 outside the contour of the resist film. The electrically-conductive lands 26 and the electrically-conductive patterns 29 are thus formed on the front and back surfaces of the core layer 13, as shown in FIG. 13. In this manner, the core substrate 12 is formed.

Figure 14:
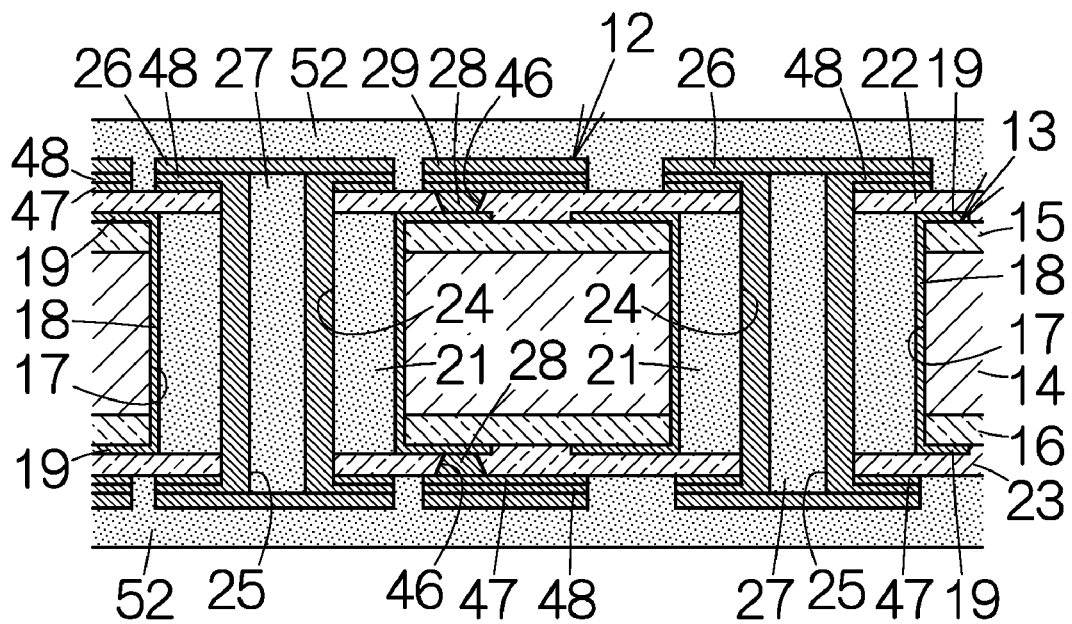
FIG. 14 is an enlarged partial sectional view schematically illustrating a process of forming an insulating layer on the surface of the core substrate.

Next, the build-up layers 31, 32 are formed on the front and back surfaces of the core substrate 12, respectively. The build-up layers 31, 32 are simultaneously formed. As shown in FIG. 14, a resin sheet 52 is overlaid on each of the front and back surfaces of the core substrate 12. The resin sheets 52 are urged against the front and back surfaces of the core substrate 12 while being subjected to a heating process. A vacuum press is executed to urge the resin sheets 52. The peak temperature of the heating process and the duration of the vacuum press are set in accordance with predetermined conditions. The resin sheets 52 are hardened or cured through the heating process. The resin sheets 52 thus provide the insulating layers 33.

Figure 15:
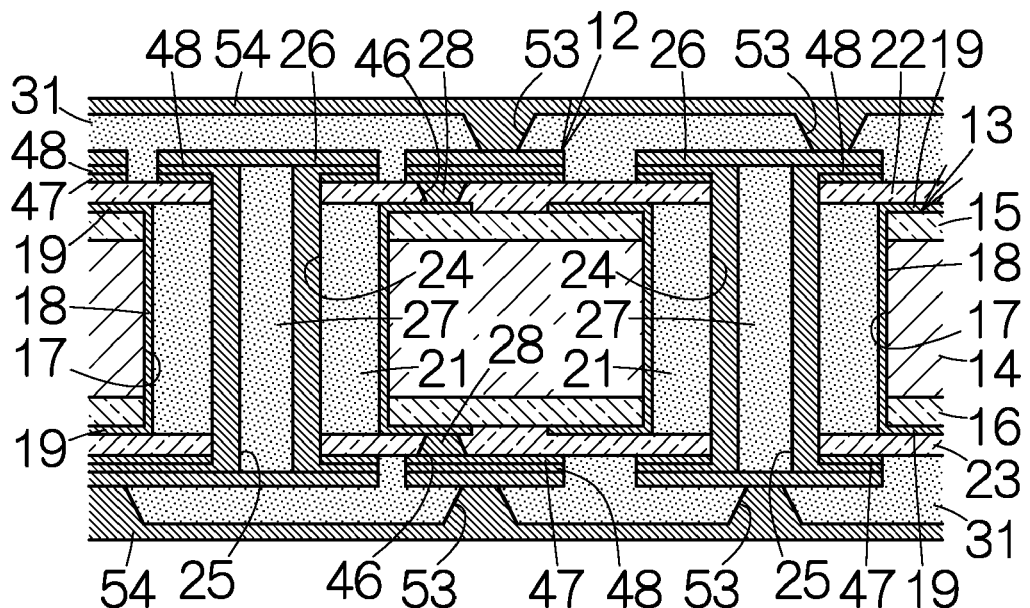
FIG. 15 is an enlarged partial sectional view schematically illustrating a process of forming a copper plating layer on the insulating layer.
Figure 16:
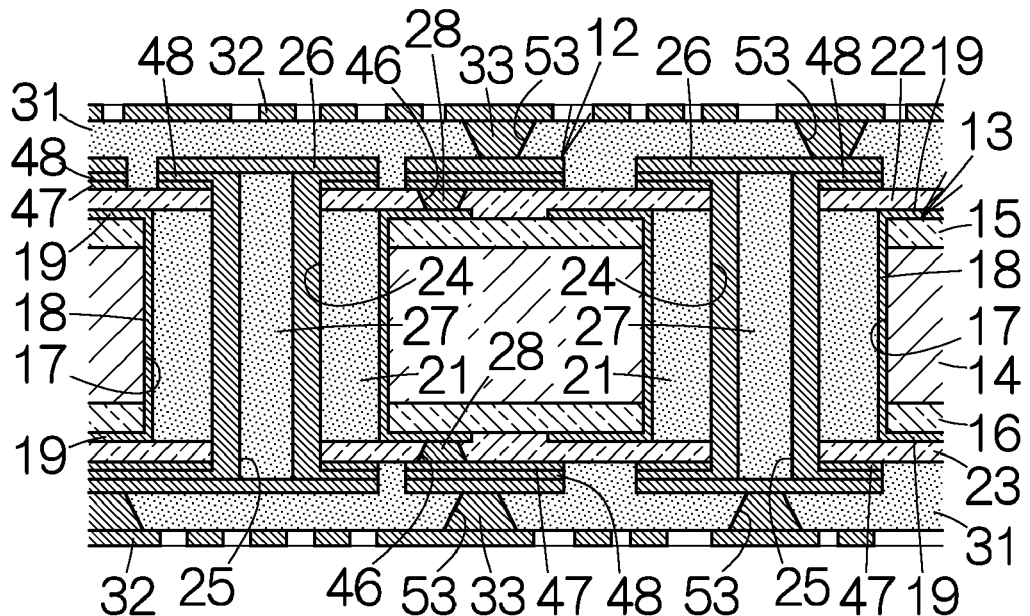
FIG. 16 is an enlarged partial sectional view schematically illustrating a process of forming an electrically-conductive pattern on the insulating layer.

A UV-YAG laser is applied to the individual insulating layer 33 at predetermined positions, for example. Apertures 53 are thus formed in the insulating layer 33, as shown in FIG. 15. The electrically-conductive lands 26 are exposed at the bottom of the apertures 53, for example. A copper plating layer 54 is formed on the surface of the insulating layer 33 and inside the apertures 53. Electroless plating is effected for forming the copper plating layer 54, for example. A resist film, not shown, is formed on the surface of the copper plating layer 53 in a predetermined pattern. Etching is effected on the copper plating layer 54 outside the contour of the resist film. The resist film is then removed. The electrically-conductive pattern 34 is thus formed on the surface of the insulating layer 33, as shown in FIG. 16. The vias 35 are formed in the apertures 53.

The process of overlaying the insulating layer 33 and the process of forming the electrically-conductive pattern 34 are repeated. The aforementioned electrically-conductive pads 36 are formed on the uppermost or exposed one of the insulating layers 33. An overcoat layer, not shown, is formed on the surface of the uppermost one of the insulating layers 33. The overcoat layer may be made of the secondary filling material, for example. Screen printing or photolithography may be effected for forming the overcoat layer, for example. Openings are formed in the overcoat layer at predetermined positions. The electrically-conductive pads 36 are exposed at the bottoms of the openings. The build-up layers 31, 32 are in this manner formed on the front and back surfaces of the core substrate 12, respectively. The printed wiring board 11 is produced.

Figure 17:
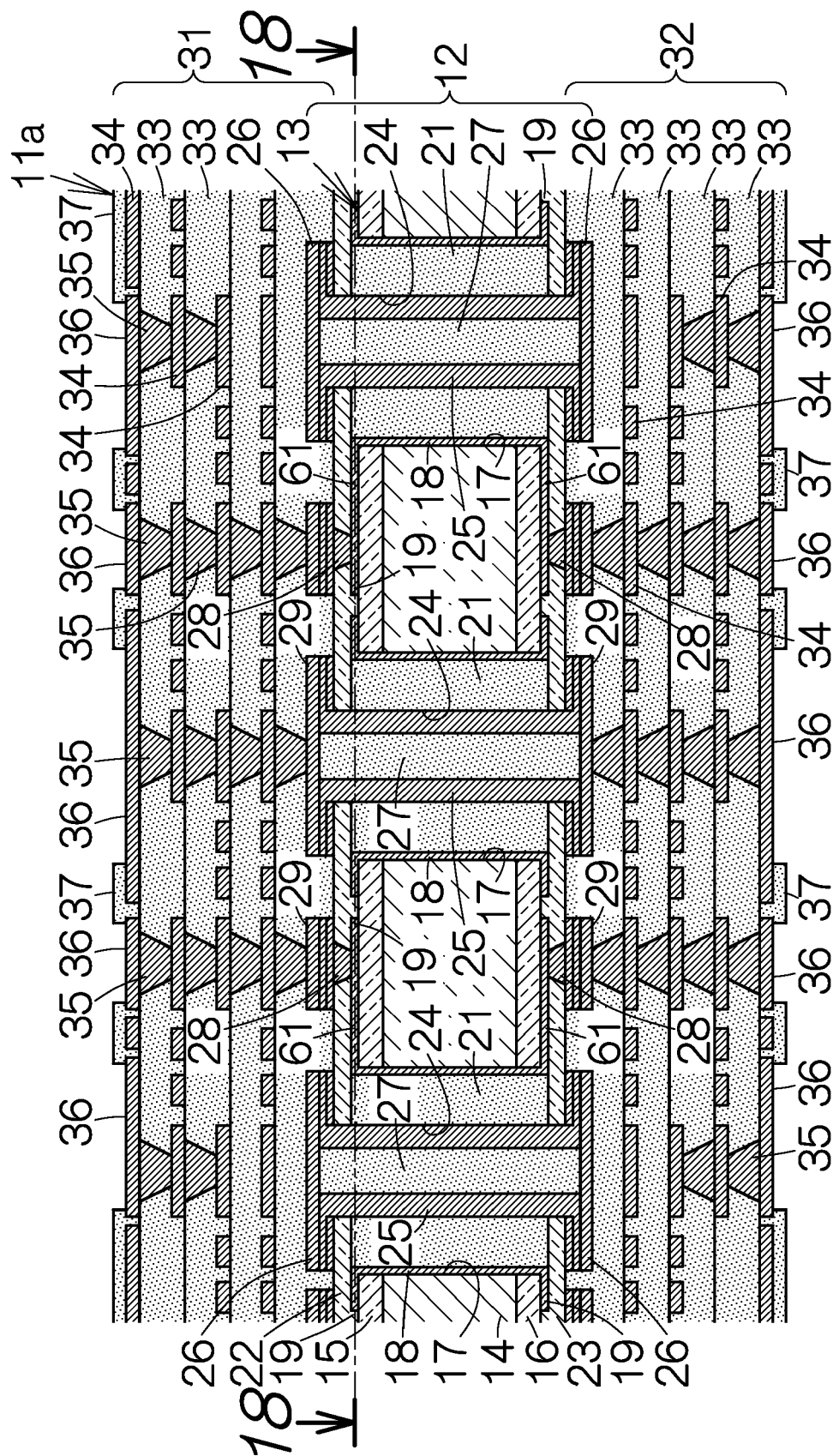
FIG. 17 is an enlarged partial sectional view schematically illustrating the cross-section of a printed wiring board according to another embodiment of the present invention.
Figure 18:
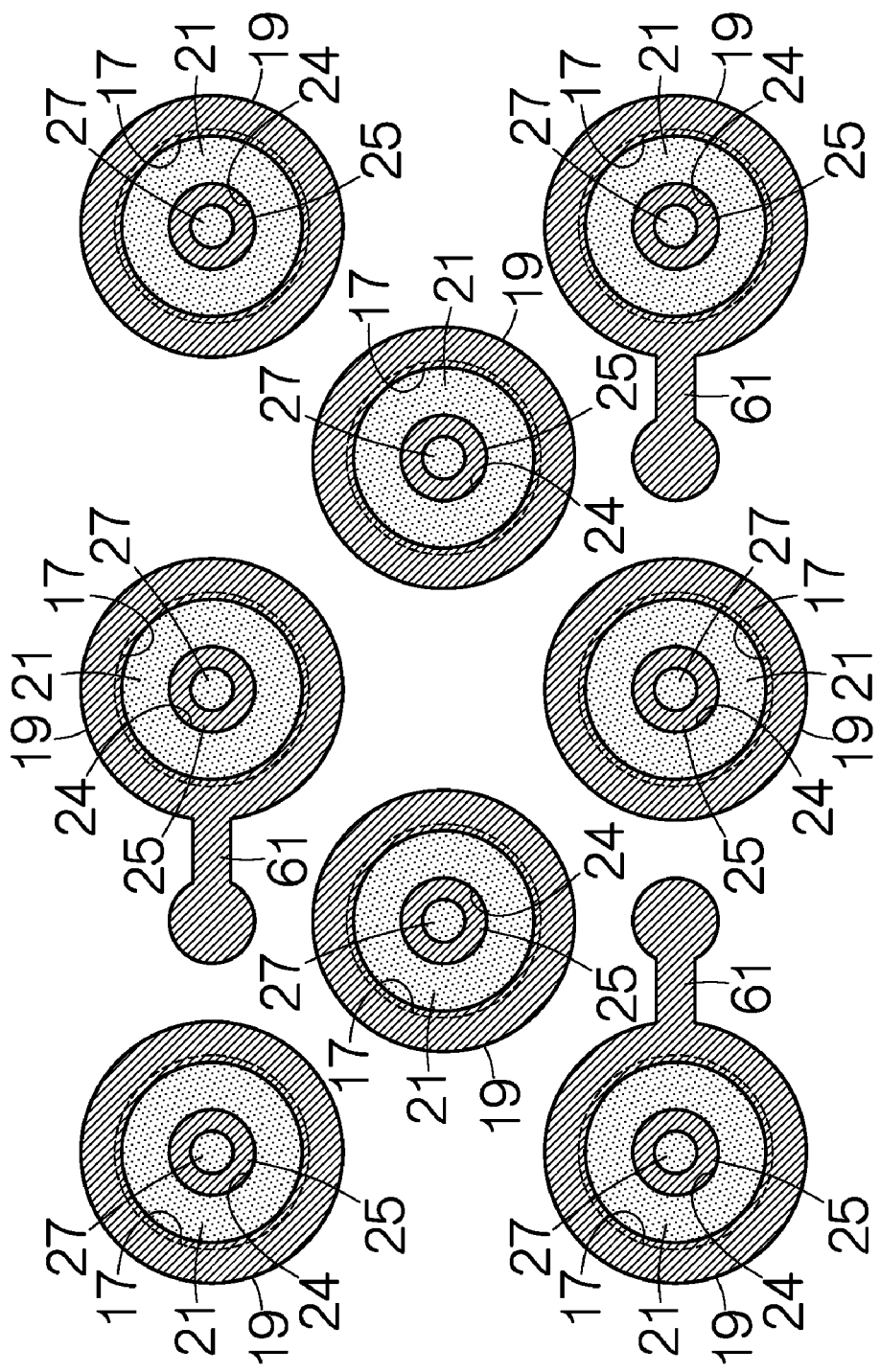
FIG. 18 is a sectional view taken along the line 18-18 in FIG. 17.

FIG. 17 schematically illustrates the cross-section of a printed wiring board 11a according to another example of the present invention. The printed wiring board 11a includes the vias 28 connected to one ends of electrically-conductive patterns 61 extending along the front and back surfaces of the core layer 13. As shown in FIG. 18, the other ends of the electrically-conductive patterns 61 are connected to the electrically-conductive lands 19. In this manner, electrical connection is established between the electrically-conductive pattern 29 and the electrically-conductive layer 14 through the large-sized vias 18, the electrically-conductive lands 19, the electrically-conductive pattern 61 and the vias 28. The electrically-conductive pattern 61 is made of an electrically-conductive material such as copper. Like reference numerals are attached to the structure or components equivalent to those of the aforementioned printed wiring board 11. The printed wiring board 11a is allowed to enjoy the advantages equivalent to those of the aforementioned printed wiring board 11.

All examples and conditional language recited herein are intended for pedagogical purposes to aid the reader in understanding the invention and the concept contributed by the inventor to furthering the art, and are to be construed as being without limitation to such specifically recited examples and conditions, nor does the organization of such examples in the specification relate to a showing of the superiority and inferiority of the invention. Although the embodiments of the present inventions have been described in detail, it should be understood that the various changes, substitutions, and alterations could be made hereto without departing from the spirit and scope of the invention.

What is claimed is:
1. A printed wiring board comprising:
a core layer having electrical conductivity;
large-sized through holes formed in the core layer, the large-sized through holes penetrating through the core layer from a front surface of the core layer to a back surface of the core layer;
a large-sized via having electrical conductivity, the large-sized via formed in a shape of a cylinder along an inward wall surface of each of all the large-sized through holes located within a specific area;

a filling material filling an inner space defined in the large-sized via;

a small-sized through hole formed in the filling material, the small-sized through hole penetrating through the filling material along a longitudinal axis of the large-sized through hole; and a small-sized via having electrical conductivity, the small-sized via formed in a shape of a cylinder along an inward wall surface of the small-sized through hole.

2. The printed wiring board according to claim 1, wherein the core layer contains carbon fiber exposed at the inward wall surface of the large-sized through hole, the carbon fiber connected to the large-sized via.

3. The printed wiring board according to claim 2, further comprising an electrically-conductive pattern formed on at least one of the front and back surfaces of the core layer, the electrically-conductive pattern connected to the large-sized via.

4. The printed wiring board according to claim 1, further comprising a build-up layer formed on at least one of the front and back surfaces of the core layer.

* * * * *